Oct. 24, 1961 B. E. HILL 3,005,944

POWER SUPPLIES FOR USE IN THERMOELECTRIC REFRIGERATION SYSTEMS

Filed Feb. 9, 1960

INVENTOR.
BRUCE E. HILL

BY Herman Seid

ATTORNEY.

United States Patent Office 3,005,944
Patented Oct. 24, 1961

3,005,944

POWER SUPPLIES FOR USE IN THERMOELECTRIC REFRIGERATION SYSTEMS

Bruce E. Hill, Mason City, Iowa, assignor to Carrier Corporation, Syracuse, N.Y., a corporation of Delaware Filed Feb. 9, 1960, Ser. No. 7,666
7 Claims. (Cl. 321—5)

Figure 1:
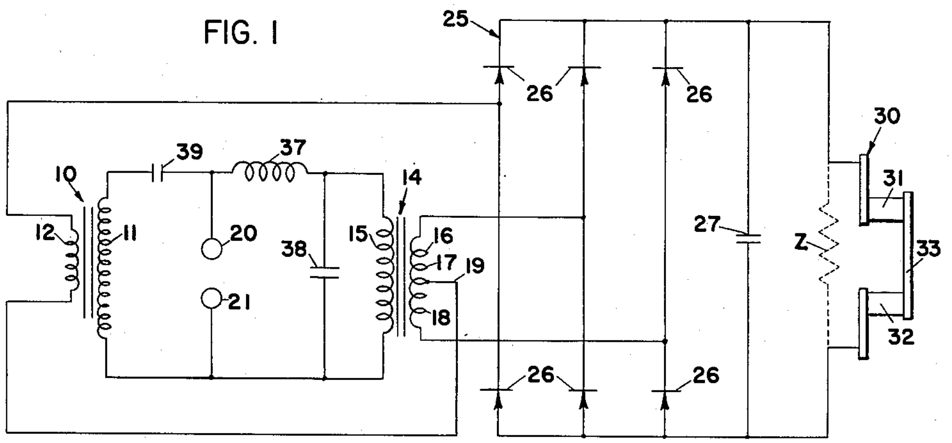

This invention relates to a method and means for the conversion of an alternating current to unidirectional current and more particularly to the conversion of single phase alternating current into a polyphase alternating current which may be adapted to be rectified to provide a relatively ripple free unidirectional current output from the rectifier for use in thermoelectric heating and cooling systems including air conditioning and refrigeration applications. This invention further relates to an improved means for converting single phase alternating current into a polyphase alternating current.

In recent years, considerable interest has surrounded the feasibility of utilizing thermoelectric elements as a means for heating or cooling an area to be refrigerated or air conditioned. The increasing availability of semiconducting materials suitable for use in the production of thermoelectric junctions having excellent heat pumping characteristics has intensified interest in this field. However, a serious obstacle to the effective use of thermoelectric materials in the field of air conditioning and refrigeration arises because of the desirability of supplying a substantial amount of power to the thermoelectric junctions at a relatively low voltage and consequently a relatively high current.

In order to produce effective cooling of an area, for example in a refrigerator, by a thermoelectric device which is capable of being installed in the average home, it is generally necessary to supply the power required for operation of the device from a standard single phase alternating current line, such as is generally available in homes. On the other hand, the power required by a thermoelectric device of the type described must be supplied to the device in the form of unidirectional current. The amount of cooling which is provided by a thermoelectric device of the type described is proportional to the current which flows through the thermoelectric elements of the device. On the other hand, the current flowing through the thermoelectric elements tends to heat them due to their inherent resistance, and the resistive heating so produced is proportional to the square of the current which flows through the thermoelectric elements. Consequently, an operating point is reached where increased current through the thermoelectric elements produces relatively more heating than cooling and the overall cooling capacity of the thermoelectric device decreases. In effect, ripple in the current supplied to the thermoelectric elements constitutes an instantaneous increase in current which may therefore materially degrade the performance of the entire device by exceeding the optimum design current. In order to effectively utilize a thermoelectric device, it is often desirable to operate at the point of maximum cooling capacity and ripple therefore becomes a serious limitation on the effectiveness of a thermoelectric cooler. It is also common to operate a thermoelectric device at the point of maximum efficiency (maximum coefficient of performance) and here again ripple seriously degrades the performance of the device by deviating from the desired design point.

It is necessary, therefore, that the unidirectional current supplied to a thermoelectric device be extremely uniform and free of ripple in order to produce efficient cooling of an area to be conditioned. However, while it is relatively simple to inexpensively filter a high voltage at a relatively low current, the costs of the components necessary to effectively filter a low voltage being supplied at a relatively high current makes a thermoelectric system of the type described economically unattractive. Conventional full-wave rectification of a single phase current source, such as is provided by a stepdown transformer connected across a power line, provides a relatively high ripple component necessitating the use of capacitor banks having many thousands of microfarads of capacitance in order to bring the ripple component of the rectified current down to an acceptably satisfactory value for use in a thermoelectric refrigeration system which may require, for example, a supply voltage of about ten volts at a current of ten amperes.

One approach to the thermoelectric power supply problem involves the connection of the large number of thermoelectric elements each requiring a small voltage in series so that a higher voltage supply may be used to provide the requisite power. This solution, however, has the serious disadvantage that the failure of a single element or junction in the series will produce failure of the entire series and consequently the whole device. From a standpoint of reliability, it is far more desirable to connect the thermoelectric junction forming elements in parallel with one another so that the failure of a few thermoelectric elements or junctions will not materially disrupt the operation of the thermoelectric device. In addition, even if the thermoelectric elements of a small thermoelectric device such as a household refrigerator are all connected in series, the voltage drop across the series is still so small that a relatively low voltage power supply must be employed to supply current to the thermoelectric device. This means that relatively large capacitors are still required to provide the requisite ripple attenuation for effective operation of the device. A further solution to the problem is to reduce the cross-section of the thermoelectric elements thereby increasing their resistance and consequently the voltage drop across the series. However, this scheme is thwarted in actual practice by the inherent brittleness of the semi-conducting materials which comprise thermoelectric elements which increase the likelihood of failure of one of them and hence, of the entire device.

It is well known that the rectified unidirectional current output of a polyphase alternating current rectifier when used with a balanced polyphase input to the rectifier provides a very small percentage of undesirable ripple with respect to the total voltage output of the rectifier. It would be desirable, therefore, to convert the single phase line current available in most homes to a balanced polyphase alternating current, rectify the polyphase current by means of a full-wave pollphase rectifier, filter the rectified current and supply the same to the thermoelectric device. Since the percentage of ripple contained in the output current of a polyphase rectifier is relatively small to start with, a relatively small and inexpensive capacitor or other filter circuit may be used, if desired, to supply the thermoelectric device with current having the desired uniformity and freedom from ripple. In addition, the ripple frequency of a rectified polyphase current is higher than that of a rectified single phase current and consequently less capacitance is needed to reduce ripple to a given percentage thereby still further reducing size and cost of the thermoelectric device.

The devices heretofore available for conversion of single phase alternating current into a balanced three-phase alternating current such as rotary converters have required expensive machinery or complex circuitry, the size, installation and maintenance cost of which largely or totally offsets the desirability of using them. It is apparent, therefore, that a need exists for a simple, inexpensive device for converting single phase current into polyphase current using passive components having no moving parts to get out of order.

Accordingly, it is an object of this invention to provide an improved thermoelectric heating or cooling system which is operable from a single phase source of alternating current.

It is a further object of this invention to provide an improved power supply which is capable of supplying relatively ripple free unidirectional current from a single phase alternating current source and which uses relatively small passive components which require a minimum of space and which enable the power supply to be manufactured at a relatively small cost.

It is a still further object of this invention to provide an improved electrical phase splitting circuit to convert single phase alternating current to a balanced polyphase alternating current.

These and other objects of this invention are achieved in the illustrated embodiments by connecting the primary windings of a pair of transformers to a single phase alternating current line. A phase shifting network is connected to the primary windings of the transformers in a manner to provide a phase splitter producing a balanced three-phase output current from the secondary windings of the transformers. The balanced three-phase output current of the transformers is supplied to a full-wave three-phase rectifier, the output of which powers a thermoelectric heating or cooling system. Additional filtration may be provided of the output voltage of the rectifier by the connection of a capacitor across the rectifier output, if desired.

Figure 2:
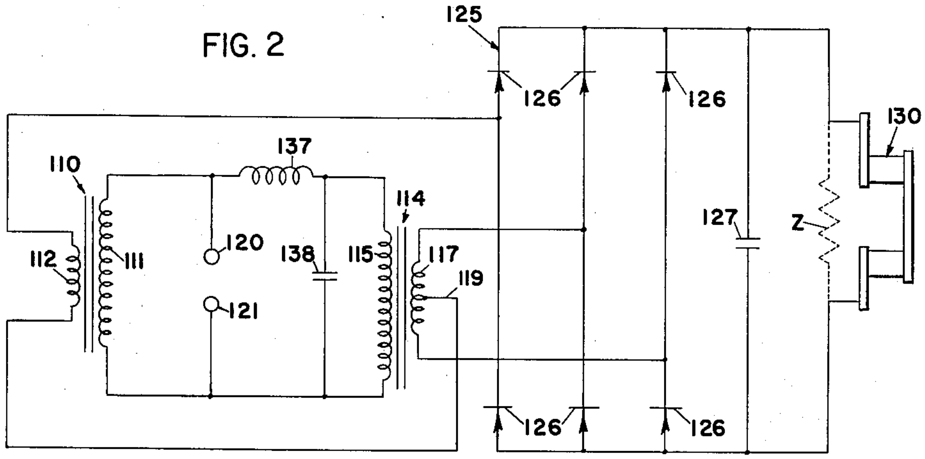

A preferred embodiment of this invention will become apparent by reference to the following specification and attached drawings wherein:

FIGURE 1 is a schematic diagram of a thermoelectric refrigeration system embodying this invention; and FIGURE 2 is a schematic illustration of a modified embodiment of this invention.

Referring particularly to FIGURE 1, there is shown a power supply comprising a first transformer 10 having primary winding 11 and secondary winding 12. A second transformer 14 has a primary winding 15 and a secondary winding 16 which is divided into a first section 17 and a second section 18 by a center tap connection 19. Termnials 20 and 21 are provided with conductors to connect the primary windings of the first and second transformers to a source of single phase alternating current, such as that readily available in most homes. One end or terminal of primary winding 11 is connected to one end or terminal of primary winding 15.

A phase shifting network is connected to primary windings 11 and 15 of first transformer 10 and second transformer 14 and together they form a phase splitter as will presently be described. The phase shifting network in the illustrated embodiment of FIGURE 1 comprises an inductor 37 in series with an end or terminal of primary winding 15 and terminal 20. A shunt capacitor 38 is connected across the ends of primary winding 15, and as can be seen from the illustration, one plate of the capacitor is connected to the inductor and a terminal of primary winding 15 and the other side of the capacitor is connected to terminal 21 and the junction of primary windings 11 and 15. A series capacitor 39 is connected in series with an end or terminal of primary winding 11 so that one plate of the capacitor is connected to an end of primary winding 11 and the other plate is connected to terminal 20 and an end or terminal of inductor 37.

It will be observed that the phase shifting network including primary winding 15, shunt capacitor 38 and series inductor 37 is in parallel with terminals 20 and 21 as is primary winding 11 and series capacitor 39. By proper selection of values for the inductor and capacitor, which will subsequently be described, the currents flowing in the primary windings may assume a quadrature relationship to each other.

One end or terminal of secondary winding 12 of first transformer 10 is connected to center tap 19 of secondary winding 17 of second transformer 14. The other end or terminal of secondary winding 12, as well as the two ends or terminals of secondary winding 17, are appropriately connected to supply the input voltage to a polyphase rectifier 25. In the illustrated embodiment, the current supplied by the phase splitting circuit, including the transformer, is a three-phase current and rectifier 25 comprises a full-wave three-phase rectifier having six diodes 26 to provide a unidirectional current output from the rectifier. It will, of course, be appreciated that if a different number of phases are provided by the phase splitting circuit than that illustrated, the polyphase rectifier will be provided for rectification of each phase supplied to it. While it is not essential that a full-wave polyphase rectifier, such as that illustrated in FIGURE 1 be provided, it is highly advantageous to do so, since the ripple content of the output current of a full-wave rectifier is substantially below that of a half-wave rectifier.

For many applications it may be desirable to further filter the full-wave rectified output of polyphase rectifier 25 and the same can be easily achieved by any convenient filter circuitry. A filter capacitor 27 having sufficient capacitance to substantially reduce the ripple component of the direct current output of rectifier 25 is shown in parallel with the rectifier output. A great advantage which is achieved by the circuit herein described is that capacitor 27 or any like filter need be only a relatively small fraction of the size which it otherwise would have to be if a single phase power supply were employed to provide a predetermined degree of ripple attenuation.

A load comprising a thermoelectric device 30 such as a thermoelectric cooler, for example, a refrigerator or air conditioner, is shown connected across the output terminals of rectifier 25. A thermoelectric device, such as that schematically illustrated in FIGURE 1, may comprise one or more pairs of thermoelectric semiconductor elements 31 and 32 having dissimilar thermoelectric properties which are electrically connected by a jumper 33 to form a thermoelectric junction. For example, thermoelectric element 31 may be a material, such as bismith telluride, or lead selenide doped with an appropriate impurity to give it P-type conductivity characteristics and thermoelectric element 32 may be appropriately doped to give it N-type conductivity characteristics. Thermoelectric devices of the character described generally possesses a substantially predetermined impedance Z. While the impedance of such a device may vary somewhat depending upon the temperature of operation or other factors, under normal operating conditions, such as might be encountered if the thermoelectric device is used as a refrigeration apparatus, the impedance thereof may, for the purposes of this invention, be said to be substantially constant and predetermined. Therefore, the load imposed upon the entire power supply circuit is a substantially predetermined value, and the components of the circuit can be selected for use with a particular load impedance.

Since the conditions of operation of the power supply circuit are substantially known, it has been found possible to select values for inductor 37 and capacitors 38 and 39, such that the output current or voltage from transformers 10 and 14 which is supplied to polyphase rectifier 25 is a substantially balanced polyphase current or voltage. By "balanced," it is meant that the various phase voltages are each displaced by substantially the same phase angle and are of substantially the same magnitude or that which in conjunction with the rectifier characteristics will produce a minimum of ripple in the rectifier output. While a comple mathematical treatment of the circuit described becomes quite complex because of the necessity of considering the electrical characteristics of each of the transformers, as well as switching characteristics of the rectifier and the electrical values which are assigned each of the components of the circuit, it has been found convenient to empirically select values for the inductors and capacitors by utilizing analog techniques.

In the particular circuit illustrated, the secondary winding 12 of first transformer 10 bears a relation to primary winding 11 and second transformer 14, such that the voltage output of secondary winding 12 is to the voltage output of secondary winding 17 as the $\frac{1}{2}\sqrt{3}:1$. Using a line voltage at terminals 20 and 21 of 120 volts, inductor 37 having 410 millihenries, capacitor 38, 11 microfarads, capacitor 39, 80 microfarads, a load impedance of 2.85 ohms and a rectifier output of 13 volts, approximately 5.8 percent ripple was observed in the unidirectional output current of rectifier 25 without the insertion of a filter of any type. This value of ripple agrees quite well with the theoretical ultimate of 4.8 percent for a full-wave three-phase rectifier having a balanced input current.

The circuit shown in FIGURE 2 illustrates a further modification of the power supply shown in FIGURE 1. It will be observed that the circuit of FIGURE 2 is generally similar to that of FIGURE 1, except series capacitor 39 which is shown in FIGURE 1, is omitted in the embodiment of FIGURE 2. It has been found that by proper selection of the value of capacitor 138 and inductor 137, the desired phase shift in the primary windings of transformers 110 and 114 may be achieved without inclusion of a series capacitor.

The power supply of FIGURE 2 comprises conductor means to supply single phase alternating current power from terminals 120 and 121 to a pair of transformers 110 and 114 having a phase shifting network connected to their primary windings 111 and 115 respectively. The phase shifting network comprises a shunt capacitor 138 across the primary winding 115 and an inductor 137 connected in series with primary winding 115 between terminal 120 and one side or terminal of primary winding 115. Terminal 121 is connected to the junction of primary windings 111 and 115, and terminal 120 is connected to the remaining end or terminal of primary winding 111. In effect, the phase shifting network including primary winding 115 is connected in parallel with primary winding 111 and terminals 120, 121.

Transformers 110 and 114 are provided with secondary windings 112 and 117 respectively having voltage output ratios in the proportion of $\frac{1}{2}\sqrt{3}:1$ respectively. One end or terminal of secondary winding 112 is connected to center tap 119 of secondary winding 117 and the remaining end or terminal as well as the ends or terminals of secondary winding 117, supply current to a polyphase rectifier 125 having diodes 126. The voltage or current output of polyphase rectifier 125 may be filtered, if desired, by a filter capacitor 127 or other appropriate means before being supplied to thermoelectric device 130.

As in the preceding embodiment, thermoelectric device 130 may comprise a thermoelectric heating or cooling system such as a refrigerator adapted to condition a desired area. It will be readily understood that the thermoelectric device described may find particular application in the field of household refrigerators, as well as air conditioning of rooms or other enclosures.

A power supply circuit was constructed according to FIGURE 2 having a single phase line input voltage of 108 volts, inductor 137 was 180 millihenries, capacitor 138 was 23 microfarads, the load impedance was 1.1 ohms, the rectifier output voltage supplied to the load was 10 volts and the observed ripple was approximately 6.8 percent. While the ripple observed in the example given in this embodiment was slightly higher than that of the previous example given for the embodiment of FIGURE 1, it will be appreciated that both circuits gave relatively low ripple percentages even when series capacitor 39 was eliminated.

In both the embodiments illustrated in FIGURES 1 and 2, the method used to supply and operate a thermoelectrical device from a single phase source of alternating current comprises splitting the single phase alternating current into a polyphase alternating current and rectifying the polyphase alternating current to produce a unidirectional current having low ripple. The means for splitting the single phase alternating current comprises a pair of transformers with specially connected secondary windings, as previously described, and with an appropriate phase shifting network in the circuit of the primary transformer windings so as to place the currents flowing in the primary windings substantially in quadrature relation to each other.

It will be understood that in both the embodiments of FIGURE 1 and FIGURE 2, the thermoelectric device may have a number of parallel connected chains of series connected thermoelectric junction forming elements but that the number of thermoelectric elements which are connected in each chain should be kept to a minimum for the reason that the failure of a single juncture in a series will result in inoperativeness of a smaller group of thermoelectric junctions than if a large number of junctions are connected in each chain. It is also to be understood that while ends or terminals of the transformers are referred to, this term means the operative connection to the transformer, rather than the physical or electrical end of the transformer winding. For example, it is contemplated that the "end" or terminal of the secondary winding of the first transformer 10 or 110 may actually comprise a tap placed at the appropriate voltage point. This construction is advantageous since it enables the transformer manufacturer to utilize the transformer in circuits other than that contemplated by this invention.

Further, while circuits of FIGURES 1 and 2 have been described with the inductor and capacitor placed in a particular position with respect to the primary winding of one of the transformers, this position can be reversed and the inductor and capacitor placed in the primary winding of the other transformer. However, because the values of inductance and capacitance which are selected in the phase shifting network employed are interdependent upon the various circuit constants, including the characteristics of the transformer employed, some adjustment in circuit values may be necessary to provide optimum performance.

It will be seen that in operation the phase shifting network which comprises either capacitors 38 and 39 and inductor 37 or capacitor 138 and inductor 137 cause the voltage relationships between the primary windings of the transformers to be 90° out of phase. When the transformer primaries are in this quadrature relation to one another and the secondary windings bear the described relationship, the result will be that the input to the polyphase rectifier will be a balanced three-phase current. When a balanced three-phase current is supplied to a full-wave three-phase rectifier, as illustrated in the drawings, the unidirectional current output at the terminals of the rectifier will contain a minimum of ripple, assuming the rectifier characteristics are also balanced. If the rectifier characteristics are not balanced then some adjustment of component values may be required for optimum performance of the power supply. It is to be understood that while a "balanced" polyphase output is referred to throughout, the term "balanced" is intended to be interpreted to cover such unbalance as may be found to be necessary in the output of the phase splitters in order to compensate for rectifier unbalance due to varying diode characteristics, for example. In any event, the selection of optimum values for the components is dependent on those values which provide minimum ripple in the unidirectional current supplied to the load for the particular system employed. In the event a load having an impedance differing from the design impedance is to be employed, it is necessary to readjust the values in the phase shifting network to compensate for the differing load impedance, because the balanced three-phase relationship desired holds only for a particular load impedance. This fact, however, does not constitute a serious disadvantage in the design of a thermoelectric system, because the power supply employed may be called upon to deliver power to a relatively fixed and predetermined load.

While there has been described for purposes of illustration a balanced three-phase system it is to be understood that still higher phase numbers could be achieved by embodying the principles of this invention with a consequent further reduction in filter component size and cost. For example, by adding a second set of secondary windings to the first and second transformers similar to the described secondary windings but wound in the opposite direction, a second three-phase output current may be obtained, each leg of which is 180° out of phase with the first three-phase output current and hence, a balanced six-phase system is created. Likewise, while the components have been referred to by their common electrical names, e.g., capacitor, it will be understood that any element having the essential electrical characteristic, e.g., capacitance, of the component may be employed in its place and is intended to be encompassed within the scope of the terms used. This invention, therefore, is not limited to the described embodiments but may be otherwise embodied within the scope of the following claims:

I claim:

1. A power supply circuit adapted to supply a relatively ripple free unidirectional current to a substantially predetermined load impedance from a single phase source of alternating current comprising a first transformer and a second transformer, each said transformer having a primary and a secondary winding, a phase shifting network connected with one of said primary windings, said phase shifting network comprising an inductor in series with said one primary winding and a capacitor connected in parallel with said one primary winding, said phase shifting network including said one primary winding being connected in parallel with the primary winding of the other of said transformers and with means to connect the said primary winding of said other transformer in parallel across a source of single phase alternating current thereby forming a series phase shifting circuit comprising said inductor in series with the parallel combination of said capacitor and said one primary winding wherein said series phase shifting circuit is connected in parallel with the primary winding of said other transformer and with said means to connect the primary winding of said other transformer across said source of single phase alternating current, the secondary winding of said first transformer bearing a relationship with the primary winding thereof and with the windings of the second transformer such that the voltage induced therein bears a relationship to the voltage induced in the secondary winding of said second transformer as $\frac{1}{2}\sqrt{3}:1$, said secondary winding of said second transformer being center tapped, one end of the secondary winding of said first transformer being connected to the secondary winding of said second transformer at said center tap, the other end of the secondary winding of said first transformer and the ends of the secondary winding of said second transformer being operatively connected to the input of a polyphase rectifier, and the unidirectional current output terminals of said rectifier being connected to a load having a substantially predetermined impedance, said inductor and said capacitor having values of inductance and capacitance respectively chosen so as to provide substantially a minimum of ripple in said unidirectional current output supplied to said load by providing a substantially balanced three-phase input to said rectifier.

2. A power supply circuit as defined in claim 1 wherein said load comprises a semiconductor device requiring a relatively ripple free unidirectional current for efficient operation.

3. A power supply circuit as defined in claim 1 wherein said phase shifting network further includes a second capacitor in series with one of the ends of said other transformer and said means for connecting said other transformer to said source of single phase alternating current, one plate of said second capacitor being connected to said other transformer and the other plate thereof being connected to said last-named means.

4. In a thermoelectric cooling system, a thermoelectric junction and a power supply adapted to supply a relatively ripple free unidirectional current to a substantially predetermined load impedance comprising said thermoelectric junction from a single phase source of alternating current, said power supply comprising a first and a second transformer, said transformers each having a primary winding with a pair of terminals and a secondary winding with a pair of terminals, a capacitor connected in parallel with the primary winding of said second transformer, an inductor connected in series with the parallel combination of said capacitor and said primary winding of said second transformer, said series combination of said inductor with said parallel combination of said capacitor and said primary winding of said second transformer being connected in parallel with the primary winding of said first transformer and being adapted to be connected in parallel with a source of single phase alternating current, the secondary winding of said first transformer bearing a relationship to the primary winding thereof and to the windings of said second transformer such that the voltage induced in said secondary winding of said first transformer bears a relationship to the voltage induced in the secondary winding of said second transformer substantially as the ratio of $\frac{1}{2}\sqrt{3}:1$, said secondary winding of said second transformer being center tapped, one terminal of the secondary winding of said first transformer being connected to said center tap, the other terminal of the secondary winding of said first transformer and the terminals of the secondary winding of the second transformer being connected to a polyphase rectifier, said rectifier having output terminals adapted to be connected with said load having a substantially predetermined impedance, said capacitor and said inductor having values of capacitance and inductance respectively chosen to produce substantially minimum ripple in the voltage output of said rectifier by providing a substantially symmetrical polyphase input into said polybase rectifier for said substantially predetermined load impedance.

5. A thermoelectric cooling system as defined in claim 4 wherein said rectifier comprises a full-wave polyphase rectifier.

6. A thermoelectric cooling system as defined in claim 4 further including a second capacitor connected across the output of said rectifier having a capacitance sufficient to further reduce the amount of ripple in said rectifier output current.

7. A thermoelectric cooling system as defined in claim 4 further including a second capacitor in series with one of the terminals of the primary winding of said first transformer.

References Cited in the file of this patent

UNITED STATES PATENTS

| | | |
|---|---|---|
| 1,843,521 | Smith | Feb. 2, 1932 |
| 2,442,960 | Pohm | June 8, 1948 |
| 2,453,263 | Potter | Nov. 9, 1948 |
| 2,748,338 | Williamson | May 29, 1956 |
| 2,910,836 | Karrer | Nov. 3, 1959 |
| 2,922,284 | Danielson et al. | Jan. 26, 1960 |

UNITED STATES PATENT OFFICE

CERTIFICATE OF CORRECTION

Patent No. 3,005,944 October 24, 1961

Bruce E. Hill

It is hereby certified that error appears in the above numbered patent requiring correction and that the said Letters Patent should read as corrected below.

Column 2, line 53, for "pollphase" read -- polyphase -- column 4, line 72, for "comple" read -- complete --; column 8, line 50, for "polybase" read -- polyphase --.

Signed and sealed this 3rd day of April 1962.

(SEAL)
Attest:

ERNEST W. SWIDER
Attesting Officer

DAVID L. LADD
Commissioner of Pa